(12) United States Patent
Chen et al.

(10) Patent No.: US 10,470,316 B2
(45) Date of Patent: Nov. 5, 2019

(54) MANUFACTURING METHOD OF CIRCUIT BOARD

(71) Applicant: Winbond Electronics Corp., Taichung (TW)

(72) Inventors: Yu-Ming Chen, Taichung (TW); Yi-Der Wu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 133 days.

(21) Appl. No.: 15/808,818

(22) Filed: Nov. 9, 2017

(65) Prior Publication Data

US 2018/0139854 A1 May 17, 2018

(30) Foreign Application Priority Data

Nov. 17, 2016 (CN) .......................... 2016 1 1022605

(51) Int. Cl.
*B29C 41/02* (2006.01)
*H05K 3/46* (2006.01)
(Continued)

(52) U.S. Cl.
CPC .......... *H05K 3/4664* (2013.01); *B29C 64/112* (2017.08); *B29C 64/118* (2017.08);
(Continued)

(58) Field of Classification Search
CPC ... B29C 64/106; B29C 64/112; B29C 64/118; B29C 64/124; B29C 64/129;
(Continued)

(56) References Cited

U.S. PATENT DOCUMENTS

2007/0134848 A1* 6/2007 Wegerer .............. H01L 23/3114
438/121
2007/0286946 A1 12/2007 Yamaguchi et al.
2018/0170873 A1* 6/2018 Das ........................ C08F 32/06

FOREIGN PATENT DOCUMENTS

JP     H11163499      6/1999
TW     200938042      9/2009
(Continued)

OTHER PUBLICATIONS

"Office Action of Taiwan Counterpart Application", dated Mar. 9, 2018, p. 1-p. 7.

(Continued)

*Primary Examiner* — Leo B Tentoni
(74) *Attorney, Agent, or Firm* — JCIPRNET

(57) ABSTRACT

A manufacturing method of a circuit board includes: performing a first printing process to form a first insulating layer having a first circuit depressed pattern; performing a second printing process to form a first circuit layer in the first circuit depressed pattern; checking whether a real position of the first circuit layer is diverged from a predetermined position; determining whether the shift level of the position of the first circuit layer is more than a predetermined level; performing the first printing process to form the second insulating layer, wherein when the shift level is more than the predetermined level and the thickness of a second insulating layer to be formed on the first insulating layer is not greater than a tolerance thickness, the second insulating layer has a hole at least partially overlapping the real position; and performing the second printing process to form a conductive plug in the hole.

8 Claims, 10 Drawing Sheets

(51) Int. Cl.
*H05K 3/00* (2006.01)
*H05K 3/40* (2006.01)
*B29C 64/30* (2017.01)
*B33Y 80/00* (2015.01)
*B29C 64/129* (2017.01)
*B29C 64/386* (2017.01)
*B29C 64/124* (2017.01)
*B29C 64/112* (2017.01)
*B29C 64/393* (2017.01)
*H05K 3/12* (2006.01)
*B29C 64/118* (2017.01)
B29L 31/34 (2006.01)
B33Y 10/00 (2015.01)

(52) U.S. Cl.
CPC .......... *B29C 64/124* (2017.08); *B29C 64/129* (2017.08); *B29C 64/30* (2017.08); *B29C 64/386* (2017.08); *B29C 64/393* (2017.08); *B33Y 80/00* (2014.12); *H05K 3/0011* (2013.01); *H05K 3/0014* (2013.01); *H05K 3/12* (2013.01); *H05K 3/4053* (2013.01); *H05K 3/4076* (2013.01); *H05K 3/465* (2013.01); *H05K 3/467* (2013.01); *H05K 3/4644* (2013.01); *B29L 2031/3425* (2013.01); *B33Y 10/00* (2014.12); *H05K 3/125* (2013.01); *H05K 2203/163* (2013.01)

(58) Field of Classification Search
CPC ... B29C 64/135; B29C 64/386; B29C 64/393; B29L 2031/3425; B33Y 10/00; B33Y 80/00; H05K 3/0011; H05K 3/0014; H05K 3/12; H05K 3/125; H05K 3/4053; H05K 3/4076; H05K 3/4644; H05K 3/4664; H05K 3/467
USPC .............................. 264/40.1, 308, 401, 406
See application file for complete search history.

(56) References Cited

FOREIGN PATENT DOCUMENTS

| | | |
|---|---|---|
| TW | 201031296 | 8/2010 |
| TW | 201108906 | 3/2011 |
| TW | I425899 | 2/2014 |
| TW | 201429353 | 7/2014 |

OTHER PUBLICATIONS

"Office Action of Taiwan Counterpart Application", dated May 10, 2018, p. 1-p. 8.

* cited by examiner

MANUFACTURING METHOD OF CIRCUIT BOARD

CROSS-REFERENCE TO RELATED APPLICATION

This application claims the priority benefit of China application serial no. 201611022605.6, filed on Nov. 17, 2016. The entirety of the above-mentioned patent application is hereby incorporated by reference herein and made a part of this specification.

BACKGROUND

Field of the Invention

The invention relates to a manufacturing method of a circuit board and more particularly, to a manufacturing method of a circuit board using a printing process.

Description of Related Art

In a conventional process of manufacturing a multilayer circuit board, a vertical hole is formed in a substrate by performing a mechanical drilling process or a laser drilling process. Then, a conductive layer is formed on the substrate and in the hole. Next, a horizontal circuit pattern is formed by performing a lithography process and an etching process. Thereafter, another substrate is laminated thereon, and the aforementioned steps are repeated.

However, in addition to complicated manufacturing steps, the conventional process also has other disadvantages, such as material over-consumption and environmental pollution. Moreover, for the multilayer circuit board, each manufacturing step (e.g., drilling, lithography and etching) requires tolerance, which likely results in an issue of poor yield of the circuit board.

SUMMARY

The invention is directed to a manufacturing method of a circuit board, which adopts printing processes to manufacture the circuit board.

According to an embodiment of the invention, a manufacturing method including the following steps is provided. A first printing process is performed to form a first insulating layer having a first circuit depressed pattern. A second printing process is performed to form a first circuit layer in the first circuit depressed pattern. Whether a real position of the first circuit layer is diverged from a predetermined position of the first circuit layer is checked. When the real position of the first circuit layer is diverged from the predetermined position of the first circuit layer, whether a shift level of the real position diverged from the predetermined position is more than a predetermined level is determined. The first printing process is performed to form a second insulating layer on the first insulating layer. When the shift level is more than the predetermined level, and a thickness of a second insulating layer to be formed on the first insulating layer is not greater than a tolerance thickness, a hole is formed in the second insulating layer, and a position of the hole at least partially overlaps the real position. The second printing process is performed to form a conductive plug in the hole.

In the invention, after a circuit layer of a circuit board is formed by a printing process, a position of the circuit layer is first checked to determine whether a real position of the circuit layer is diverged from a predetermined position. In this way, when the real position of the circuit layer is diverged from the predetermined position, a printing process subsequently performed to form an insulating layer for defining a conductive plug may be instantly adjusted, such that the conductive plug can be employed to accurately connect the circuit layer and another subsequently formed circuit layer.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Embodiments are provided below for describing the invention. In the embodiments below, the same components are labeled by the same symbols.

In the embodiments below, a "first printing process" refers to a printing process of forming an insulating layer, which is, for example, a three dimensional (3D) digital light processing (DLP) process. Additionally, a "second printing process" refers to a printing process of forming a conductive layer, which is, for example, a conductive ink jet printing process.

Figure 1:
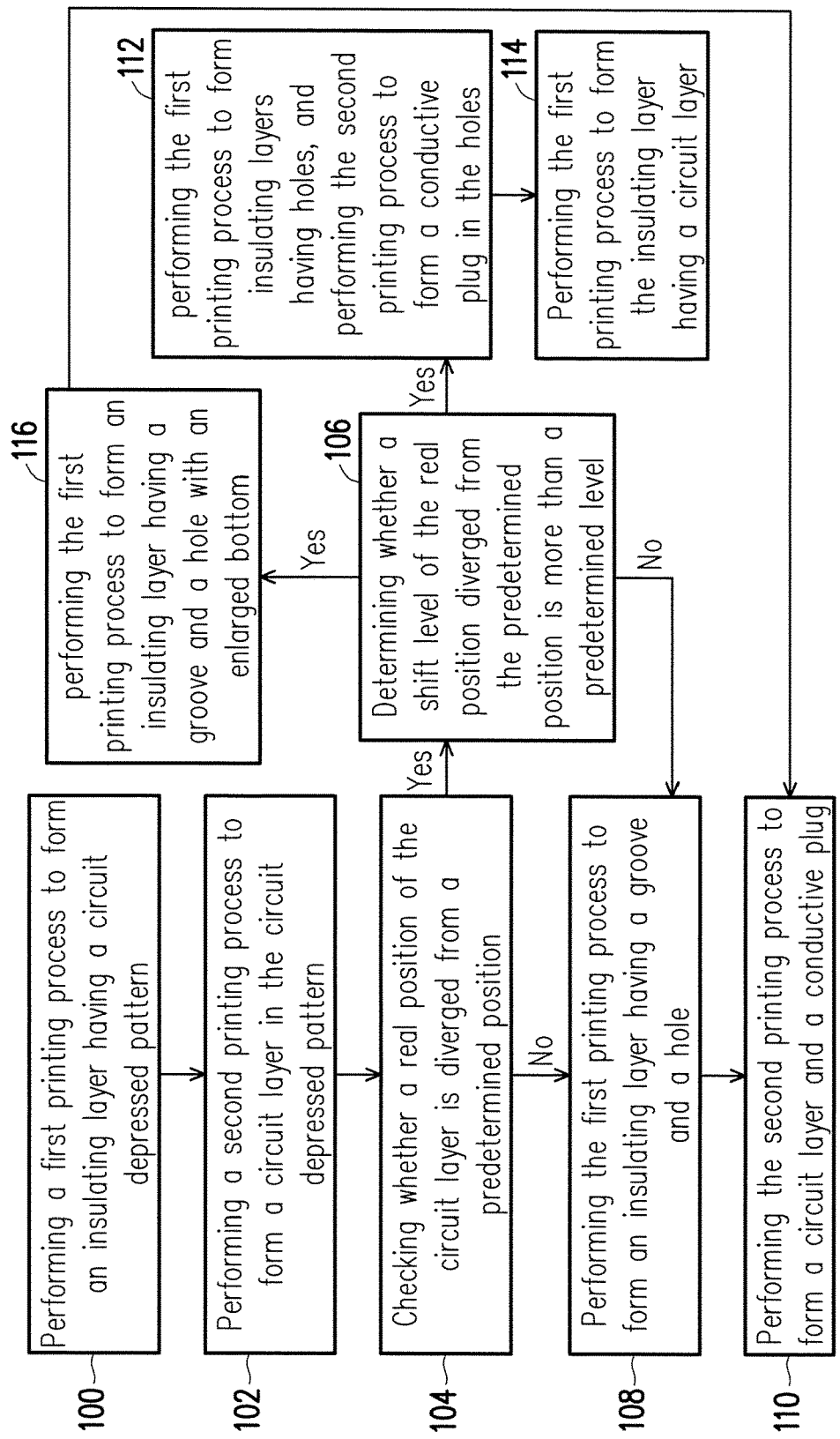
FIG. 1 is a flow chart of a manufacturing method of a circuit board according to an embodiment of the invention.
Figure 6:
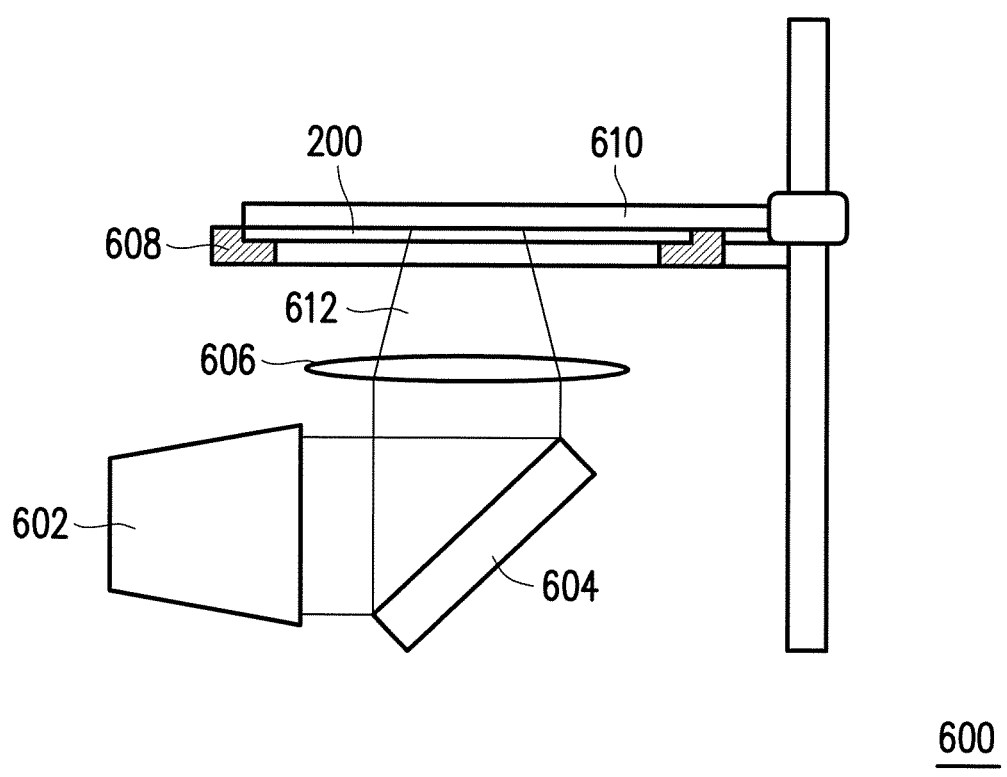
FIG. 6 is a schematic view illustrating a printing apparatus employed in the embodiments of the invention.

FIG. 1 is a flow chart of a manufacturing method of a circuit board according to an embodiment of the invention. FIG. 2A to FIG. 2D are cross-sectional views illustrating the flow of the manufacturing method of the circuit board according to a first embodiment of the invention. First, referring to both FIG. 1 and FIG. 2A, in step 100, a first printing process is performed to form an insulating layer 200. Referring to FIG. 6, in the present embodiment, the first printing process is performed by employing a printing apparatus 600. The printing apparatus 600 includes a light source 602, a reflection device 604, a lens 606, a tank 608 and a print device 610. The insulating layer 200 is formed in the tank 608 by the printing device 610. According to surface tension, a surface of the insulating layer 200 may be a curve surface, such that a curing error may happen if the insulating layer 200 is cured by the light passing through the curve surface. To avoid such curing error, a bottom surface of the tank 608 may be transparent, so that a light beam 612 generated by the light source 602 can irradiate the bottom surface of the tank 608 to cure the insulating layer 200. To reduce the size of the printing apparatus 600, the reflection device 604 and the lens 606 can be installed, such that a path of the light beam 612 can be changed by the reflection device 604 and then adjusted by the lens 606 before irradiating the bottom surface of the tank 608. After being cured, the insulating layer 200 has a circuit depressed pattern 202. In the present embodiment, the circuit depressed pattern 202 includes at least one groove 202a and at least one hole 202b.

Figure 2A:
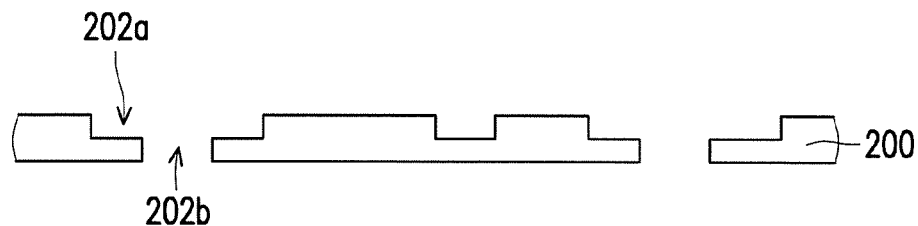
FIG. 2A to FIG. 2D are cross-sectional views illustrating the flow of the manufacturing method of the circuit board according to a first embodiment of the invention.
Figure 2B:
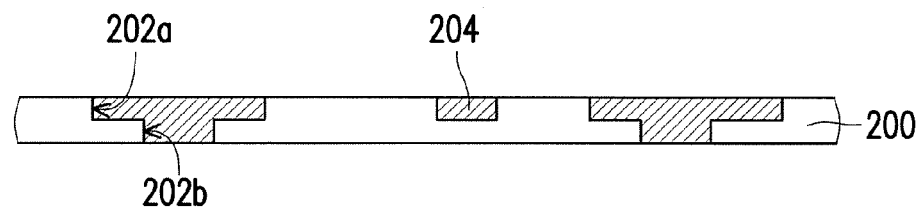

Thereafter, referring to both FIG. 1 and FIG. 2B, in step 102, a second printing process is performed to fill a circuit layer 204 in the circuit depressed pattern 202. Specifically, the circuit layer 204 in the groove 202a may be considered as a first circuit layer in a multilayer circuit board, and the circuit layer 204 in the hole 202b may be considered as a pad connected with an external device.

Then, in step 104, whether a real position of the circuit layer 204 is diverged from a predetermined position is checked, and in step 106, when the real position of the circuit layer is diverged from the predetermined position, whether a shift level of the real position diverged from the predetermined position is more than a predetermined level is determined. When the insulating layer 200 is formed by performing the first printing process, a position or a shape of the circuit depressed pattern 202 may deviate due to influence by a process environment, a user's operation or other factors. Since positions of circuit layers and a conductive plug formed in subsequent processes are predetermined, the aforementioned deviation may cause affection to the yield of the circuit board. When the real position of the circuit layer 204 is not diverged from the predetermined position, or the deviation is within a tolerable range (i.e., the shift level is not more than the predetermined level), the deviation is acceptable because it causes limited affection to the yield of the circuit board. However, when the deviation exceeds the tolerable range, it may cause reduction to transmission efficiency of electric signals, or even cause an open circuit. In this way, the yield of the circuit board may be dramatically reduced. Thus, in the invention, after the circuit layer 204 is formed, the position of the circuit layer 204 is instantly checked, and a follow-up process is instantly adjusted according to the check result. A method of checking the position of the circuit layer 204 includes, for example, automatic optical image detection.

Figure 2C:
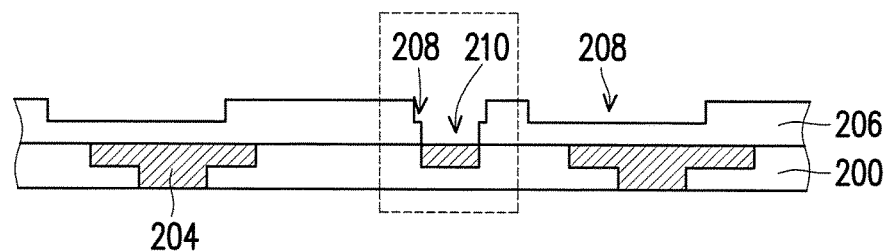

Thereafter, referring to both FIG. 1 and FIG. 2C, in the present embodiment, it is determined that the position of the circuit layer 204 is not diverged from the predetermined position (or the shift level is not more than the predetermined level). Thus, in step 108, the first printing process is performed to form an insulating layer 206 on the insulating layer 200. The insulating layer 206 has a circuit depressed pattern including at least one groove 208 and at least one hole 210. The groove 208 is employed to define a second circuit layer, and the hole 210 is employed to define a conductive plug connecting the first circuit layer and the second circuit layer. As shown by the dashed box in FIG. 2C, since the real position of the circuit layer 204 is not diverged from the predetermined position (or the shift level is not more than the predetermined level), a ratio of an overlapping area of the hole 210 and the real position of the circuit layer 204 to an area of the hole 210 may be not less than 0.75, i.e., the conductive plug subsequently formed in the hole 210 may be effectively aligned with the circuit layer 204.

Figure 2D:
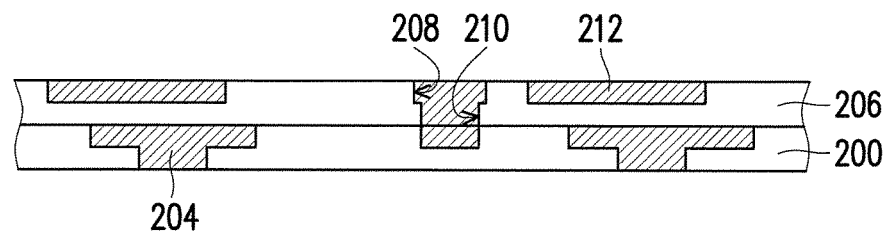

Then, referring to both FIG. 1 and FIG. 2D, in step 110, the second printing process is performed to fill a circuit layer 212 in the groove 208 and the hole 210. Specifically, the circuit layer 212 in the groove 208 may be considered as the second circuit layer in the multilayer circuit board, and the circuit layer 212 in the hole 210 may be considered as the conductive plug employed for connecting the first circuit layer and the second circuit layer. As the conductive plug is accurately connected to the predetermined position of the circuit layer 204, the issue of poor yield of the circuit board may be avoided.

In the present embodiment, the circuit board illustrated in FIG. 2D has two circuit layers, but the invention is not limited thereto. In another embodiment, when the circuit board has more circuit layers, the position of each circuit layer may be checked after each circuit layer is formed, and subsequent processes are then performed. In this way, it may be ensured that the conductive plug may be accurately connected with the circuit layers.

FIG. 3A to FIG. 3E are cross-sectional views illustrating the flow of the manufacturing method of the circuit board according to a second embodiment of the invention. Referring to both FIG. 1 and FIG. 3A, the circuit layer 204 is formed in the insulating layer 200, as illustrated in FIG. 2B. In the present embodiment, the result of step 104 is no, i.e. a position of a connection portion 204a of the circuit layer 204 is diverged from a predetermined position 300. Then, in step 106, whether a shift level of the real position of the connection portion 204a diverged from the predetermined position is more than a predetermined level is determined. In the present embodiment, the shift level is more than the predetermined level. In this circumstance, since the position of the connection portion 204a is diverged from the predetermined position 300, and the shift level is more than the predetermined level, a follow-up process has to be instantly adjusted to prevent the subsequently formed conductive plug from being incapable of accurately connecting with the circuit layer 204.

Additionally, a vertical distance between two circuit layers has a predetermined value (which is also referred to as a tolerance thickness herein) based on a final thickness of a circuit board. Thus, the thickness of the insulating layer formed between two circuit layers must be not greater than the tolerance thickness. In the present embodiment, the process of forming the conductive plug is adjusted in a condition that the thickness of the insulating layers for defining the conductive plug is not greater than the tolerance thickness.

Figure 3A:
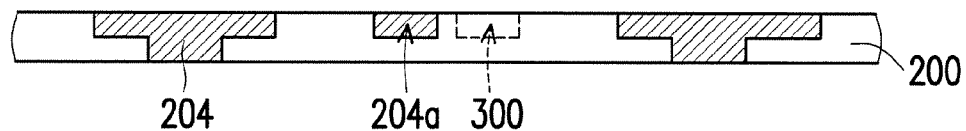
FIG. 3A to FIG. 3E are cross-sectional views illustrating the flow of the manufacturing method of the circuit board according to a second embodiment of the invention.
Figure 3B:
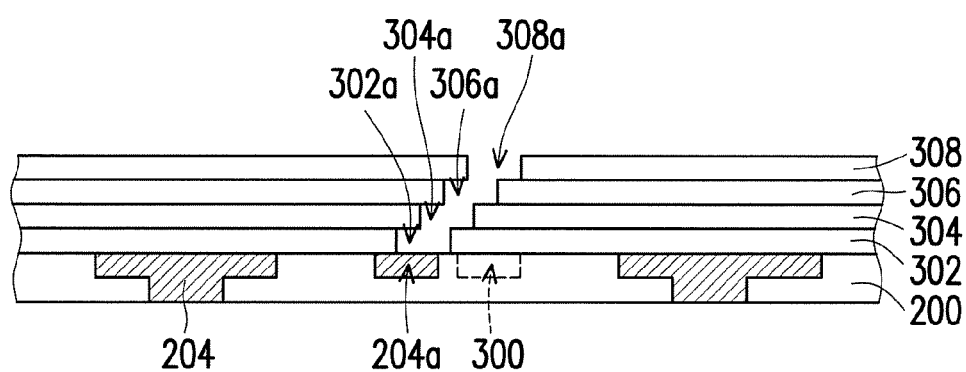
Figure 3C:
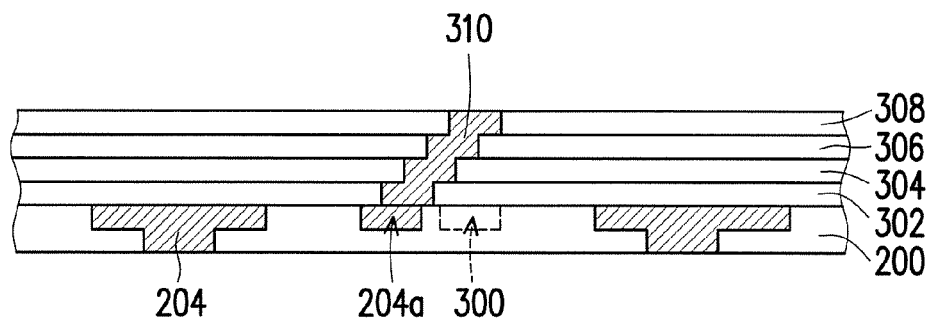

Thereafter, referring to both FIG. 1 and FIG. 3B, in step 112, the first printing process is performed to form an insulating layer 302 on the insulating layer 200. The insulation layer 302 has a hole 302a. A position of the hole 302a is diverged from the position of the connection portion 204a toward the predetermined position 300, and partially overlaps the connection portion 204a. Then, the first printing process is performed to form an insulating layer 304 on the insulating layer 302. In this circumstance, a total thickness of the insulating layers 302 and 304 is smaller than the tolerance thickness. The insulation layer 304 has a hole 304a. A position of the hole 304a is diverged from a position of the hole 302a toward the predetermined position 300, and partially overlaps the hole 302a. Thereafter, the first printing process is performed to form an insulating layer 306 on the insulating layer 304. A total thickness of the insulating layers 302, 304 and 306 is smaller than the tolerance thickness. The insulation layer 306 has a hole 306a. A position of the hole 306a is diverged from a position of the hole 304a toward the predetermined position 300, and partially overlaps the hole 304a. Then, the first printing process is performed to form an insulating layer 308 on the insulating layer 306. A total thickness of the insulating layers 302, 304, 306 and 308 is equal to the tolerance thickness. The insulation layer 308 has a hole 308a. A position of the hole 308a is diverged from a position of the hole 306a toward the predetermined position 300, and partially overlaps the hole 306a. In this circumstance, the position of the area 308a overlaps predetermined position 300. Then, referring to FIG. 3C, the second printing process is performed to form a conductive plug 310 in the holes 302a, 304a, 306a and 308a for connecting with the connection portion 204a.

Figure 3D:
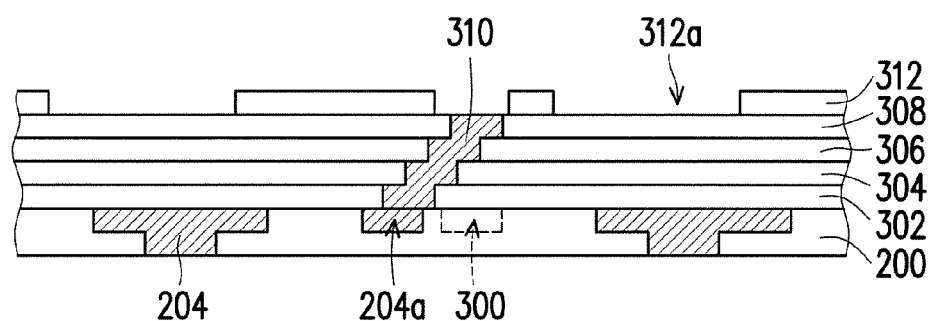

Thereafter, referring to both FIG. 1 and FIG. 3D, in step 114, the first printing process is performed to form an insulating layer 312 on the insulating layer 308. The insulating layer 312 has a circuit depressed pattern 312a. Then, referring to FIG. 3E, the second printing process is performed to form a circuit layer 314 in the circuit depressed pattern 312a. In the present embodiment, since the position of the connection portion 204a is diverged from the predetermined position 300, the circuit layer 204 may be incapable of being accurately connected with the circuit layer 314 by a vertical conductive plug (e.g., the conductive plug illustrated in FIG. 2D) having an end at the predetermined position 300. Thus, the conductive plug 310 simultaneously connected with the connection portion 204a and overlapping the predetermined position 300 is formed by gradually diverging the holes 302a, 304a, 306a and 308a toward the predetermined position 300, such that the circuit layers 204 and 314 may be accurately connected.

In the present embodiment, four insulating layers are formed between the circuit layers 204 and 314, but the invention is not limited thereto. In another embodiment, the number of the insulating layers may be adjusted based on actual situation (e.g., a divergence level between the connection portion 204a and the predetermined position 300, or the number of the insulating layers that may be included between the circuit layers 204 and 314).

Figure 4A:
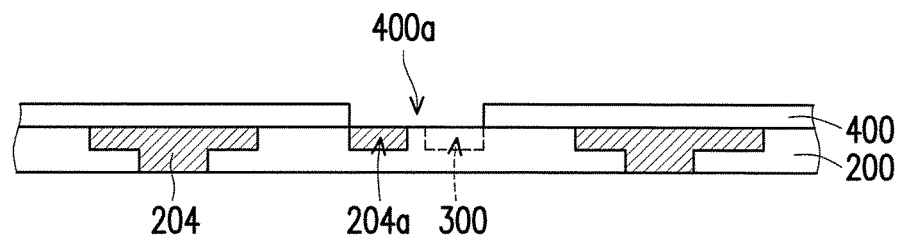
FIG. 4A to FIG. 4C are cross-sectional views illustrating the flow of the manufacturing method of the circuit board according to a third embodiment of the invention.
Figure 4B:
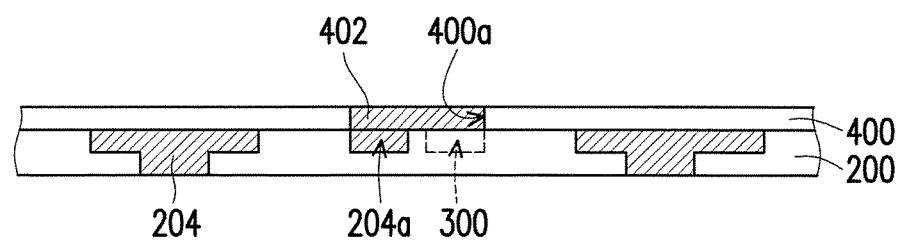
Figure 4C:
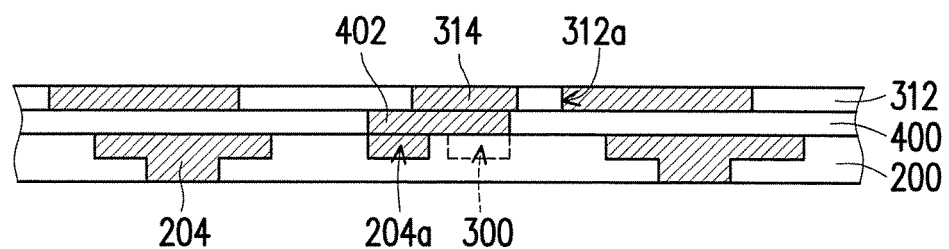

FIG. 4A to FIG. 4C are cross-sectional views illustrating the flow of the manufacturing method of the circuit board according to a third embodiment of the invention. First, referring to both FIG. 1 and FIG. 4A, in the present embodiment, the result of step 104 is no, i.e., the position of a connection portion 204a of the circuit layer 204 formed in the insulating layer 200 is diverged from the predetermined position 300 in the present embodiment. Then, in step 106, it is determined that the shift level of the real position of the connection portion 204a diverged from the predetermined position is more than the predetermined level. Thereafter, in step 112, the first printing process is performed to form an insulating layer 400 on the insulating layer 200. In this circumstance, a thickness of the insulating layer 400 is equal to the tolerance thickness. The insulation layer 400 has a hole 400a. In the present embodiment, the hole 400a exposes the connection portion 204a and the predetermined position 300. Then, referring to FIG. 4B, the second printing process is performed to form a conductive plug 402 connected with the connection portion 204a in the hole 400a.

Figure 3E:
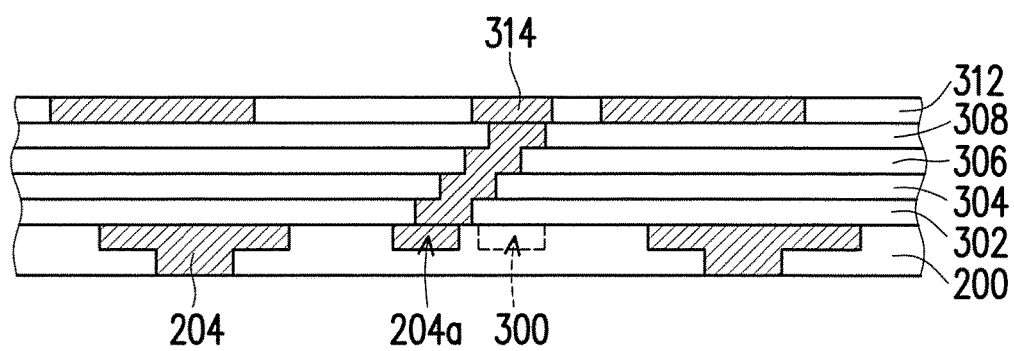

Then, referring to both FIG. 1 and FIG. 4C, in step 114, the first printing process is performed to form the insulating layer 312 having the circuit depressed pattern 312a on the insulating layer 400, as illustrated in FIG. 3D to FIG. 3E. Thereafter, the second printing process is performed to form the circuit layer 314 in the circuit depressed pattern 312a.

In the present embodiment, since the position of the connection portion 204a is diverged from the predetermined position 300, the circuit layer 204 may be incapable of being accurately connected with the circuit layer 314 by the vertical conductive plug (e.g., the conductive plug illustrated in FIG. 2D) having an end at the predetermined position 300. By enlarging the conductive plug 402 to cover the connection portion 204a and the predetermined position 300, the conductive plug 402 may be accurately connected with the circuit layers 204 and 314.

Figure 5A:
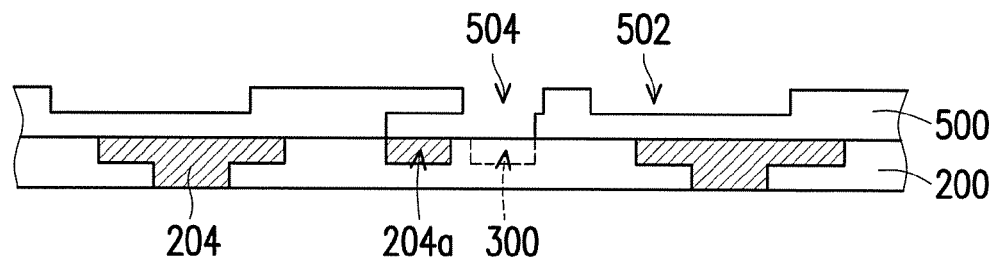
FIG. 5A to FIG. 5B are cross-sectional views illustrating the flow of the manufacturing method of the circuit board according to a fourth embodiment of the invention.
Figure 5B:
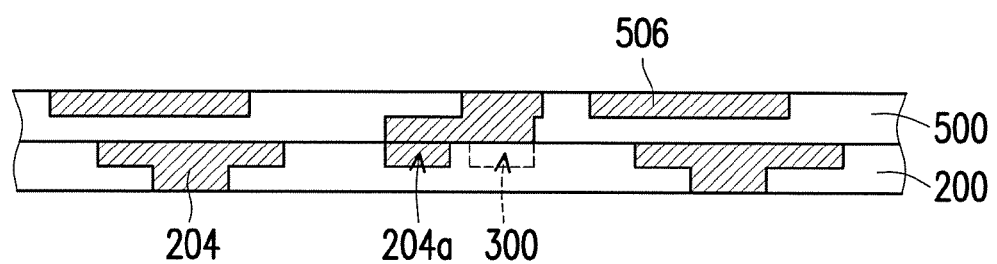

FIG. 5A to FIG. 5B are cross-sectional views illustrating the flow of the manufacturing method of the circuit board according to a fourth embodiment of the invention. First, referring to both FIG. 1 and FIG. 5A, in the present embodiment, the result of step 104 is no, i.e. the position of a connection portion 204a of the circuit layer 204 formed in the insulating layer 200 is diverged from the predetermined position 300 in the present embodiment. Then, in step 106, it is determined that the shift level of the real position of the connection portion 204a diverged from the predetermined position is more than the predetermined level.

In the present embodiment, the vertical distance between the two circuit layers is small, i.e., the thickness of the insulating layers for defining the conductive plug is greater than the tolerance thickness, thus, the process of forming the conductive plug between the two circuit layers is incapable of being adjusted in the same way as in the second and the thirds embodiments.

Thereafter, in step 116, the first printing process is performed to form an insulating layer 500 on the insulating layer 200. The insulating layer 500 has a circuit depressed pattern including at least one groove 502 and at least one hole 504. In the present embodiment, the bottom of the hole 504 is enlarged to simultaneously overlap the connection portion 204a and the predetermined position 300. Thereafter, referring to FIG. 5B, the second printing process is performed to form a circuit layer 506 in the groove 502 and the hole 504. Specifically, the circuit layer 506 in the groove 502 may be considered as the second circuit layer in the multilayer circuit board, and the circuit layer 506 in the hole 504 may be considered as the conductive plug employed for connecting the first circuit layer and the second circuit layer.

In the present embodiment, since the position of the connection portion 204a is diverged from the predetermined position 300, the circuit layer 204 may be incapable of being accurately connected with the circuit layer 314 by the vertical conductive plug (e.g., the conductive plug illustrated in FIG. 2D) having an end at the predetermined position 300. Thus, in a condition that no additional insulating layer is allowed to be formed, the conductive plug may cover the connection portion 204a and the predetermined position 300 by forming the conductive plug with a greater size in the insulation layer 500, such that the conductive plug may be accurately connected with the first and the second circuit layers.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. A manufacturing method of a circuit board, comprising:
   performing a first printing process to form a first insulating layer having a first circuit depressed pattern;
   performing a second printing process to form a first circuit layer in the first circuit depressed pattern;
   checking whether a real position of the first circuit layer is diverged from a predetermined position of the first circuit layer, and when the real position of the first circuit layer is diverged from the predetermined position of the first circuit layer, determining whether a shift level of the real position diverged from the predetermined position is more than a predetermined level;

performing the first printing process to form a second insulating layer on the first insulating layer, when the shift level is more than the predetermined level and a thickness of the second insulating layer to be formed on the first insulating layer is not greater than a tolerance thickness, wherein the second insulating layer has a first hole at least partially overlapping the real position; and performing the second printing process to form a conductive plug in the first hole, wherein when the shift level is more than the predetermined level and the thickness of the second insulating layer to be formed on the first insulating layer is smaller than the tolerance thickness, the first hole of the second insulating layer is diverged from the real position of the first circuit layer toward the predetermined position of the first circuit layer, and the manufacturing method of the circuit board further comprises:

after forming the second insulating layer, and before forming the conductive plug, performing the first printing process to form a third insulating layer on the second insulating layer, wherein a total thickness of the second insulating layer and the third insulating layer is equal to the tolerance thickness, the third insulating layer has a second hole, and a position of the second hole is diverged from the position of the first hole toward the predetermined position of the first circuit layer to overlap the predetermined position of the first circuit layer;

performing the second printing process to form the conductive plug in the first and the second holes;

performing the first printing process to form a fourth insulating layer on the third insulating layer, wherein the fourth insulating layer has a second circuit depressed pattern; and performing the second printing process to form a second circuit layer in the second circuit depressed pattern, wherein the second circuit layer is electrically connected with the first circuit layer through the conductive plug.

2. The manufacturing method of the circuit board according to claim 1, wherein when the real position of the first circuit layer is not diverged from the predetermined position, or the shift level is not more than the predetermined level, the manufacturing method of the circuit board comprises:

performing the first printing process to form the second insulating layer on the first insulating layer, wherein the second insulating layer has the second circuit depressed pattern and the first hole, and a ratio of an overlapping area of the first hole and the real position to an area of the first hole is not less than 0.75; and performing the second printing process to form the second circuit layer in the second circuit depressed pattern and form the conductive plug in the first hole, wherein the second circuit layer is electrically connected with the first circuit layer through the conductive plug.

3. The manufacturing method of the circuit board according to claim 1, wherein when the shift level is more than the predetermined level, and the thickness of the second insulating layer to be formed on the first insulating layer is equal to the tolerance thickness, the position of the first hole simultaneously overlaps the real position and the predetermined position, and the manufacturing method of the circuit board further comprises:

after forming the conductive plug, performing the first printing process to form the third insulating layer on the second insulating layer, wherein the third insulating layer has the second circuit depressed pattern; and performing the second printing process to form the second circuit layer in the second circuit depressed pattern, wherein the second circuit layer is electrically connected with the first circuit layer through the conductive plug.

4. The manufacturing method of the circuit board according to claim 1, wherein when the shift level is more than the predetermined level, and the thickness of the second insulating layer to be formed on the first insulating layer is greater than the tolerance thickness, the manufacturing method of the circuit board further comprises:

performing the first printing process to form the second insulating layer on the first insulating layer, wherein the second insulating layer has the second circuit depressed pattern and the first hole, the position of the first hole simultaneously overlaps the real position of the first circuit layer and the predetermined position of the first circuit layer, and forming the second circuit layer in the second circuit depressed pattern while performing the second printing process to form the conductive plug, wherein the second circuit layer is electrically connected with the first circuit layer through the conductive plug.

5. The manufacturing method of the circuit board according to claim 1, wherein the first printing process comprises a three-dimensional (3D) digital light processing (DLP) process.

6. The manufacturing method of the circuit board according to claim 5, wherein the first insulating layer is formed in a tank during the first printing process, a bottom surface of the tank is transparent, and a light beam in the 3D DLP process irradiates the first insulating layer through the bottom surface of the tank.

7. The manufacturing method of the circuit board according to claim 1, wherein the second printing process comprises a conductive ink jet printing process.

8. The manufacturing method of the circuit board according to claim 1, wherein the tolerance thickness is a predetermined vertical distance between the first circuit layer and the second circuit layer to be formed on the first circuit layer.

* * * * *